(12) United States Patent
Han et al.

(10) Patent No.: US 9,741,608 B2
(45) Date of Patent: Aug. 22, 2017

(54) METHODS OF FABRICATING SEMICONDUCTOR DEVICES INCLUDING SUPPORTING PATTERNS IN GAP REGIONS BETWEEN CONDUCTIVE PATTERNS

(71) Applicants: Kyu-Hee Han, Hwaseong-si (KR); Sanghoon Ahn, Goyang-si (KR)

(72) Inventors: Kyu-Hee Han, Hwaseong-si (KR); Sanghoon Ahn, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/093,408

(22) Filed: Apr. 7, 2016

(65) Prior Publication Data

US 2016/0225658 A1    Aug. 4, 2016

Related U.S. Application Data

(63) Continuation of application No. 14/015,388, filed on Aug. 30, 2013, now Pat. No. 9,337,150.

(30) Foreign Application Priority Data

Sep. 5, 2012    (KR) .................. 10-2012-0098464

(51) Int. Cl.
*H01L 21/768* (2006.01)
*H01L 23/532* (2006.01)
*H01L 23/522* (2006.01)
*H01L 21/3105* (2006.01)
(Continued)

(52) U.S. Cl.
CPC .... *H01L 21/7682* (2013.01); *H01L 21/31058* (2013.01); *H01L 21/31111* (2013.01);
(Continued)

(58) Field of Classification Search
CPC ......... H01L 23/53295; H01L 21/76826; H01L 21/76832; H01L 21/76834; H01L 21/76835; H01L 21/7682; H01L 23/5222; H01L 23/5329; H01L 21/76877; H01L 23/528; H01L 21/31058; H01L 21/31111; H01L 21/76802; H01L 23/532
See application file for complete search history.

(56) References Cited

U.S. PATENT DOCUMENTS 6,093,634 A * 7/2000 Chen ................ H01L 21/31051
257/E21.243
6,252,290 B1    6/2001 Quek et al.
(Continued)

FOREIGN PATENT DOCUMENTS

KR    10-2010-0027580 A    3/2010
KR    10-2010-0122700 A    11/2010
KR    10-2011-0013162 A    2/2011

*Primary Examiner* — Thanh T Nguyen
(74) *Attorney, Agent, or Firm* — Myers Bigel, P.A.

(57) ABSTRACT

An integrated circuit device includes spaced apart conductive patterns on a substrate surface, and a supporting pattern on the substrate surface between adjacent ones of the conductive patterns and separated therefrom by respective gap regions. The adjacent ones of the conductive patterns extend away from the substrate surface beyond a surface of the supporting pattern therebetween. A capping layer is provided on respective surfaces of the conductive patterns and the surface of the supporting pattern. Related fabrication methods are also discussed.

20 Claims, 23 Drawing Sheets

(51) Int. Cl.
    *H01L 21/311*    (2006.01)
    *H01L 23/528*    (2006.01)
(52) U.S. Cl.
    CPC .. *H01L 21/76802* (2013.01); *H01L 21/76826* (2013.01); *H01L 21/76832* (2013.01); *H01L 21/76834* (2013.01); *H01L 21/76835* (2013.01); *H01L 21/76877* (2013.01); *H01L 23/528* (2013.01); *H01L 23/5222* (2013.01); *H01L 23/5329* (2013.01); *H01L 23/53295* (2013.01); *H01L 21/76849* (2013.01); *H01L 23/53223* (2013.01); *H01L 23/53238* (2013.01); *H01L 23/53266* (2013.01); *H01L 2924/0002* (2013.01)

(56) References Cited

U.S. PATENT DOCUMENTS

| | | |
|---|---|---|
| 6,917,109 B2 | 7/2005 | Lur et al. |
| 7,361,452 B2 | 4/2008 | Oh |
| 7,741,211 B2 | 6/2010 | Jang |
| 7,741,228 B2 | 6/2010 | Ueki et al. |
| 7,754,601 B2 | 7/2010 | Chen et al. |
| 7,998,855 B2 | 8/2011 | Chen |
| 8,298,910 B2 | 10/2012 | Nam et al. |
| 8,624,399 B2 * | 1/2014 | Usami ............... H01L 21/76807 257/758 |
| 2007/0035816 A1 | 2/2007 | Daamen et al. |
| 2008/0076258 A1 * | 3/2008 | Chen ................... H01L 21/0206 438/704 |
| 2008/0299763 A1 | 12/2008 | Ueki et al. |
| 2009/0121356 A1 | 5/2009 | Nakagawa |
| 2009/0218614 A1 | 9/2009 | Aoyama et al. |
| 2010/0270677 A1 | 10/2010 | Usami |
| 2011/0183516 A1 * | 7/2011 | Lee ..................... H01L 21/7682 438/653 |
| 2012/0104512 A1 | 5/2012 | Horak et al. |
| 2012/0126302 A1 * | 5/2012 | Noda ................... H01L 21/764 257/315 |
| 2012/0241838 A1 | 9/2012 | Nagashima et al. |

\* cited by examiner

METHODS OF FABRICATING SEMICONDUCTOR DEVICES INCLUDING SUPPORTING PATTERNS IN GAP REGIONS BETWEEN CONDUCTIVE PATTERNS

CROSS-REFERENCE TO RELATED APPLICATIONS

This application is a continuation of U.S. patent application Ser. No. 14/015,388 filed Aug. 30, 2013 which claims priority under 35 U.S.C. §119 to Korean Patent Application No. 10-2012-0098464, filed on Sep. 5, 2012, in the Korean Intellectual Property Office, the entire contents of which are hereby incorporated by reference.

BACKGROUND

Example embodiments of the inventive concept relate to semiconductor devices and methods of fabricating the same.

Semiconductor devices may be required to have higher integration, higher density, lower power consumption, and/or faster operating speeds. A semiconductor device with highly integrated circuits may include a multi-layered interconnection structure, which may be formed of a metal material (e.g., aluminum). The formation of the aluminum interconnection lines may include depositing an aluminum layer on an insulating layer and etching it to expose the insulating layer.

However, copper (instead of aluminum) may be increasingly used as a material for the interconnection line as a design rule of the semiconductor devices decreases. This may be due to the relatively high electrical resistivity of aluminum. For example, as a width of an aluminum interconnection line decreases, its resistance increases, and thus it may be difficult to realize semiconductor devices with higher operating speeds. Copper may offer advantages in cost and electrical conductivity, but there may be difficulty in patterning a copper layer using an etching technique. A damascene process may also be used to form copper interconnection lines.

Further, due to the increasing integration density of semiconductor devices, the spacing between interconnection lines may become narrower, which may result in electrical interference between interconnection lines and/or a delay in a signal transfer speed, despite the use of the copper interconnection lines.

SUMMARY

Example embodiments of the inventive concept provide semiconductor devices configured to have an increased signal transfer speed.

Other example embodiments of the inventive concept provide less complex methods of fabricating semiconductor devices.

According to example embodiments of the inventive concepts, a semiconductor device may include a substrate with a first region and a second region, conductive patterns disposed on the substrate, a capping layer provided on the conductive patterns to define an air-gap region between the conductive patterns, and a supporting pattern provided between the conductive patterns in the second region to be in contact with the capping layer pattern. The supporting pattern has a top surface that may be lower than those of the conductive patterns.

In example embodiments, a space of the conductive patterns may be smaller in the first region than in the second region.

In example embodiments, the supporting pattern has a slanted side surface.

In example embodiments, a distance between the supporting pattern and the conductive pattern adjacent thereto may be smaller at a lower portion of the supporting pattern than at an upper portion of the supporting pattern.

In example embodiments, in the second region, the air-gap region may be provided between side surfaces of the supporting pattern and the conductive patterns.

In example embodiments, the device may further include a remaining pattern provided between the conductive patterns and spaced apart from the capping layer, in the first region.

In example embodiments, the remaining pattern may be formed of the same material as the supporting pattern.

In example embodiments, the remaining pattern has a top surface lower than that of the supporting pattern.

In example embodiments, the device may further include a first protection layer disposed between the conductive pattern and the capping layer, and a second protection layer covering side surfaces of the conductive patterns.

In example embodiments, the first protection layer may be formed of a different material from that of the second protection layer.

In example embodiments, the first protection layer may include at least one of tantalum, ruthenium, cobalt, manganese, titanium, tungsten, nickel, aluminum, oxides thereof, nitrides thereof, or oxynitrides thereof, and the second protection layer may include at least one material selected from the group consisting of silicon nitride (SiN), silicon carbon nitride (SiCN) and boron nitride (BN).

In example embodiments, the second protection layer may extend between a top surface of the first protection layer and the capping layer and cover the substrate between the conductive patterns.

In example embodiments, in the second region, the second protection layer covers a side surface of the supporting pattern and may be interposed between the top surface of the supporting pattern and the capping layer.

In example embodiments, the device may further include a remaining pattern provided between the conductive patterns and spaced apart from the capping layer, in the first region. The second protection layer covers side and top surfaces of the remaining pattern.

In example embodiments, the capping layer may include at least one material selected from the group consisting of silicon dioxide ($SiO_2$), silicon nitride (SiN), carbon-doped hydrogenated silicon oxide (SiOCH), silicon carbon nitride (SiCN), and silicon oxynitride (SiON).

In example embodiments, the capping layer has a thickness of 0.1-5 nm.

In example embodiments, the supporting pattern may include at least one material selected from the group consisting of silicon dioxide ($SiO_2$), silicon nitride (SiN), silicon carbon nitride (SiCN), carbon-doped hydrogenated silicon oxide (SiOCH), and porous-carbon-doped hydrogenated silicon oxide (porous-SiOCH).

In example embodiments, in the second region, the conductive patterns adjacent to the supporting pattern may be provided to have a space of 100 nm or more.

In example embodiments, the capping layer covers a portion of an upper sidewall of the conductive pattern.

In example embodiments, the device may further include a protection layer covering a sidewall of the conductive pattern. The capping layer covers partially an upper sidewall of the protection layer.

According to example embodiments of the inventive concepts, a method of fabricating a semiconductor device may include forming an insulating layer on a substrate, patterning the insulating layer to form a plurality of recessed regions, forming conductive patterns to fill the recessed regions, performing a plasma treatment to the insulating layer, removing at least a portion of the insulating layer to expose sidewalls of the conductive patterns, and forming a sacrificial layer to fill a space between the conductive patterns, forming a capping layer on the conductive patterns and the sacrificial layer, and removing the sacrificial layer to form an air-gap region between the conductive patterns.

In example embodiments, the removing of at least a portion of the insulating layer may further include forming a supporting pattern, and the supporting pattern may be in contact with the capping layer, after the removal of the sacrificial layer.

In example embodiments, the removing of at least a portion of the insulating layer may further include forming a remaining pattern spaced apart from the capping layer, and the remaining pattern may be spaced apart from the capping layer, after the removal of the sacrificial layer.

In example embodiments, the recessed regions may be formed using an anisotropic etching process.

In example embodiments, the insulating layer may be formed of a carbon-containing material, and the etching process and the plasma treatment may be performed to remove a portion of carbons from at least a portion of the insulating layer.

In example embodiments, the plasma treatment to the insulating layer may include supplying at least one gas of $H_2$, $NH_3$, $N_2H_2$, $N_2O$, $O_2$, $CO_2$, or $CO$, with a plasma power of 300-800 W at a temperature of 200-400° C. and a pressure of 3-8 Torr.

In example embodiments, the sacrificial layer may be formed of a hydrocarbon layer.

In example embodiments, the capping layer may be formed using at least one deposition process of ALD, PE-CVD, AP-CVD, or FCVD.

In example embodiments, the removing of the sacrificial layer may include performing an ashing process decomposing the sacrificial layer into gas that can be outgassed through the capping layer.

In example embodiments, the ashing process may include supplying at least one gas of $NH_3$, $H_2$, $N_2O$, $O_2$, $CO_2$, or $CO$ at a temperature of 20-400° C.

In example embodiments, the method may further include forming a first protection layer to cover top surfaces of the conductive patterns, before the removing of at least a portion of the insulating layer.

In example embodiments, the method may further include forming a second protection layer to cover the conductive patterns, after the removing of at least a portion of the insulating layer and before the forming of the sacrificial layer.

According to further example embodiments of the inventive concepts, an integrated circuit device includes spaced apart conductive patterns on a substrate surface, and a supporting pattern on the substrate surface between adjacent ones of the conductive patterns and separated therefrom by respective gap regions. The adjacent ones of the conductive patterns extend away from the substrate surface beyond a surface of the supporting pattern therebetween. A capping layer is provided on respective surfaces of the conductive patterns and the surface of the supporting pattern.

In example embodiments, the respective gap regions may be confined by the capping layer, respective sidewalls of the conductive patterns, and respective sidewalls of the adjacent ones of the conductive patterns.

In example embodiments, the capping layer may extend on the respective sidewalls of the adjacent ones of the conductive patterns, and the respective sidewalls of the supporting pattern may be free of the capping layer.

In example embodiments, the substrate may include first and second regions. The supporting pattern may be between the adjacent ones of the conductive patterns in the second region, and ones of the conductive patterns in the first region may be free of the supporting pattern therebetween.

In example embodiments, a surface of the capping layer may be substantially planar in the first region and may be non-planar in the second region.

In example embodiments, a spacing between ones of the conductive patterns in the second region may be greater than that in the first region.

In example embodiments, a remaining pattern may be provided on the substrate surface between adjacent ones of the conductive patterns in the first region. The supporting pattern and the remaining pattern may include a same material, and the supporting pattern may extend away from the substrate surface beyond a surface of the remaining pattern.

In example embodiments, the respective gap regions may be first gap regions, and the remaining pattern may be separated from the capping layer and from the adjacent ones of the conductive patterns in the first region by a second gap region.

In example embodiments, one or more protection layers may be provided between the capping layer and the respective surfaces of the conductive patterns, and/or between the capping layer and the surface of the supporting pattern.

In example embodiments, the one or more protection layers may include first and second layers of different materials. The respective sidewalls of the conductive patterns and the supporting pattern may include the second layer thereon, and may be free of the first layer.

In example embodiments, the supporting pattern may be a carbon-containing layer having an ashing selectivity to a hydrocarbon-based sacrificial layer. The respective gap regions may include at least a portion of the hydrocarbon-based sacrificial layer therein.

In example embodiments, the respective gap regions may be an unobstructed space having a dielectric constant less than that of the supporting pattern and/or that of the capping layer.

In example embodiments, the adjacent ones of the conductive patterns having the supporting pattern therebetween may be separated by a distance of about 100 nanometers (nm) or more.

According to still further example embodiments of the inventive concepts, a method of fabricating an integrated circuit device includes forming spaced apart conductive patterns on a substrate surface, and forming respective supporting patterns on the substrate surface between adjacent ones of the conductive patterns such that the supporting patterns are separated from the adjacent ones of the conductive patterns by respective gap regions. The adjacent ones of the conductive patterns extend away from the substrate surface beyond a surface of the respective supporting patterns therebetween. A capping layer is formed on respective surfaces of the conductive patterns and on the surface of the respective supporting patterns.

In example embodiments, the respective supporting patterns may be formed by performing a plasma treatment process on respective insulating layers between the adjacent ones of the conductive patterns. The plasma treatment process may remove carbon from peripheral portions of the respective insulating layers. The peripheral portions of the respective insulating layers between the adjacent ones of the conductive patterns may be selectively etched to define the respective supporting patterns and the respective gap regions separating the respective supporting patterns from the adjacent ones of the conductive patterns.

In example embodiments, dimensions of the respective supporting patterns may be reduced as spacing between the adjacent ones of the conductive patterns is decreased.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
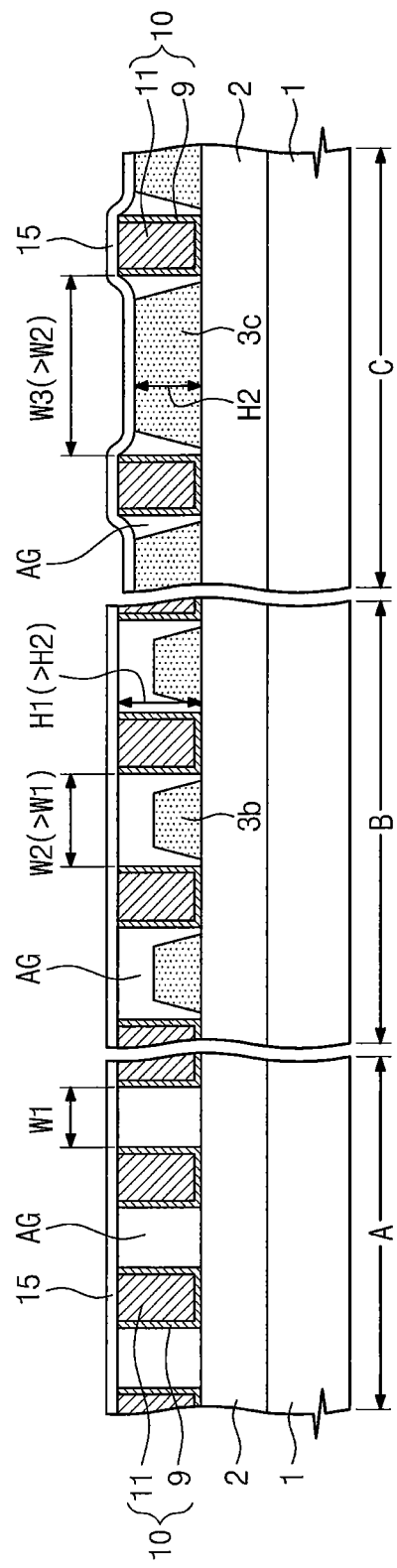
FIG. 1 is a sectional view of a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view of a semiconductor device according to example embodiments of the inventive concept.

Referring to FIG. 1, a substrate 1 including a first region A, a second region B, and a third region C may be provided. A first insulating layer 2 may be provided on the substrate 1. The first insulating layer 2 may be an interlayer insulating layer or an etch-stop layer. A device isolation layer and transistors may be provided on the substrate 1. Interconnection lines and/or contacts may be provided in the first insulating layer 2. A plurality of conductive patterns 10 may be provided on the first insulating layer 2. Each of the conductive patterns 10 may be a line-shaped pattern extending along a predetermined direction, a contact-shaped pattern, or a structure with both of contact-shaped and line-shaped patterns. At least one of the conductive patterns 10 may be electrically connected to contact plugs or interconnection lines, which may be provided in the first insulating layer 2.

The conductive pattern 10 may include a conductive layer 11 and a diffusion barrier layer 9 covering side and bottom surfaces of the conductive layer 11. The conductive layer 11 may be formed of a low resistance conductive material, such as copper, tungsten, and aluminum. The diffusion barrier layer 9 may be formed of at least one material selected from the group consisting of titanium (Ti), titanium nitride (TiN), tantalum (Ta), tantalum nitride (TaN), ruthenium (Ru), cobalt (Co), manganese (Mn), tungsten nitride (WN), nickel (Ni), and nickel boron (NiB). An air-gap region AG (also referred to herein as a gap region or gap) that is an empty or unobstructed space (e.g., a void or cavity) may be provided between the conductive patterns 10. Top surfaces of the conductive patterns 10 may be connected to a capping layer 15. The capping layer 15 may be formed of a dielectric layer having a dielectric constant of about 1.8-8. For example, the capping layer 15 may be formed of at least one material selected from the group consisting of silicon dioxide (SiO$_2$), silicon nitride (SiN), carbon-doped hydrogenated silicon oxide (SiOCH), silicon carbon nitride (SiCN), and silicon oxynitride (SiON). In example embodiments, the capping layer 15 may be formed of at least one material selected from the group consisting of silicon dioxide (SiO$_2$), carbon-doped hydrogenated silicon oxide (SiOCH), and silicon carbon nitride (SiCN). The capping layer 15 may have a thickness of 0.1 nm-5 nm.

The conductive patterns 10 may be disposed to have a first space W1 in the first region A, a second space W2, which may be greater than the first space W1, in the second region B, and a third space W3, which may be greater than the second space W2, in the third region C. In example embodiments, the third space W3 may be greater than or equivalent to 100 nm, the first space W1 may be less than or equivalent to 50 nm, and the second space W2 may range from 50 nm to 100 nm.

A supporting pattern 3c may be provided between the conductive patterns 10 on the third region C. The supporting pattern 3c may be in contact with the capping layer 15. A height H1 of a top surface of the conductive pattern 10 may be higher than a height H2 of a top surface of the supporting pattern 3c. The supporting pattern 3c may have a slanted sidewall. A distance between a bottom corner of the supporting pattern 3c and the conductive pattern 10 adjacent thereto may be smaller than a distance between a top corner of the supporting pattern 3c and the conductive pattern 10 adjacent thereto. A remaining pattern 3b may be provided between the conductive patterns 10 on the second region B. A height of a top surface of the remaining pattern 3b may be lower than that of a top surface of the supporting pattern 3c. The remaining pattern 3b may be spaced apart from the capping layer 15. Neither the remaining pattern 3b nor the supporting pattern 3c may be provided between the conductive patterns 10 on the first region A. The supporting pattern 3c may be formed of the same material as the remaining pattern 3b. The supporting pattern 3c and the remaining pattern 3b may be a dielectric layer having a dielectric constant of 1.8-8. For example, the supporting pattern 3c and the remaining pattern 3b may be a carbon-containing insulating material. In example embodiments, the supporting pattern 3c and the remaining pattern 3b may be formed of at least one material selected from the group consisting of silicon nitride (SiN), silicon carbon nitride (SiCN), carbon-doped hydrogenated silicon oxide (SiOCH), and porous-carbon-doped hydrogenated silicon oxide (porous-SiOCH). In other example embodiments, the supporting pattern 3c and the remaining pattern 3b may be formed of silicon dioxide (SiO$_2$).

In the present embodiment, the semiconductor device may be configured to include an air-gap region AG that is provided between the conductive patterns 10 and is defined by the conductive patterns 10 and the capping layer 15 provided thereon. The air-gap region AG has a dielectric constant of about 1, which is much smaller than that of other dielectric, and thus, electrical interference between the conductive patterns 10 can be minimized. This enables to increase a signal transfer speed and reduce power consumption. In addition, since the supporting pattern 3c is provided in a relatively wide region between the conductive patterns 10, the capping layer 15 can be prevented from falling or hanging down or otherwise collapsing. This can improve reliability of the semiconductor device.

FIGS. 2 through 10 are sectional views illustrating a process of fabricating the semiconductor device of FIG. 1.

Figure 2:
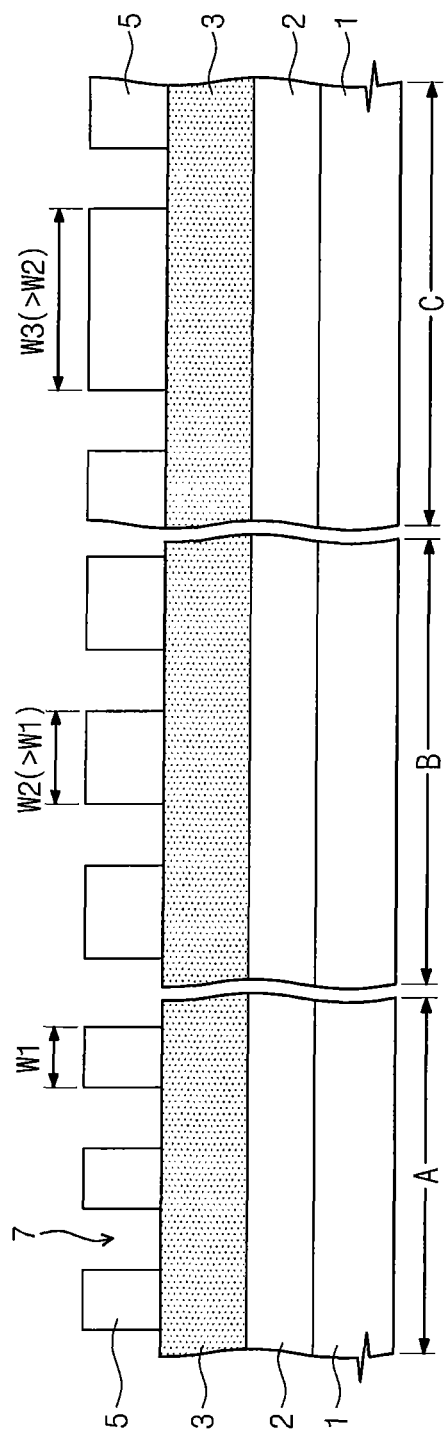
FIGS. 2 through 10 are sectional views illustrating a process of fabricating the semiconductor device of FIG. 1.

Referring to FIG. 2, a first insulating layer 2 may be formed on a substrate 1 including a first region A, a second region B, and a third region C. A device isolation layer, transistors, contact plugs, interconnection lines, an etch-stop layer, and so forth may be formed below, in, and/or on the first insulating layer 2. The first insulating layer 2 may be formed of, for example, a silicon oxide layer, a silicon nitride layer, or a silicon oxynitride layer. A second insulating layer 3 may be formed on the first insulating layer 2.

The second insulating layer 3 may be formed of a dielectric layer having a dielectric constant of 1.8-8. In example embodiments, the second insulating layer 3 may be formed of a carbon-containing dielectric layer. For example, the second insulating layer 3 may be formed of at least one material selected from the group consisting of silicon carbon nitride (SiCN), carbon-doped hydrogenated silicon oxide (SiOCH), and porous-carbon-doped hydrogenated silicon oxide (porous-SiOCH). In other example embodiments, the second insulating layer 3 may be formed of a carbon-reduced dielectric layer, such as silicon dioxide ($SiO_2$), silicon nitride, and silicon oxynitride. The second insulating layer 3 may be formed using at least one of ALD, CVD, FCVD, SOD, and diffusion process. In the case where the second insulating layer 3 is formed of the porous-SiOCH layer, at least one of thermal curing, UV curing, and e-Beam curing processes may be performed thereto.

A mask pattern 5 may be formed on the second insulating layer 3. The mask pattern 5 may be formed to have openings 7 for defining conductive patterns 10 in a subsequent process. The mask pattern 5 may be, for example, a photoresist pattern. The mask pattern 5 in the first, second, and third regions A, B, and C may be formed in such a way that widths W1, W2, and W3 thereof have the spaces W1, W2, and W3 between the conductive patterns 10, respectively, that were described with reference to FIG. 1. For example, the width W2 of the mask pattern 5 in the second region B may be greater than the width W1 of the mask pattern 5 in the first region A and be smaller than the width W3 of the mask pattern 5 in the third region C.

Figure 3:
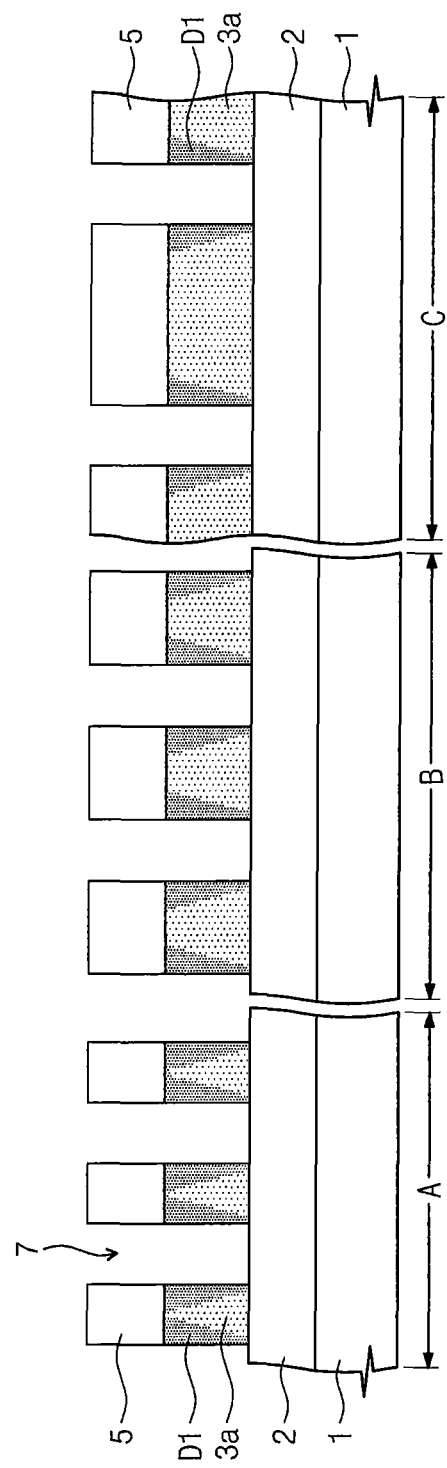

Referring to FIG. 3, the second insulating layer 3 may be anisotropically etched using the mask pattern 5 as an etch mask to form a second insulating layer pattern 3a having a planar shape copied from or otherwise corresponding to the opening 7. During the anisotropic etching process, etch damage may occur on a sidewall of the second insulating layer pattern 3a. For example, an upper portion of the second insulating layer pattern 3a may be exposed to an etchant used in the anisotropic etching process for a greater duration compared to a lower portion of the second insulating layer pattern 3a, and thus, in the second insulating layer pattern 3a, an etch damage portion D1 may be larger at the upper portion than at the lower portion. In this case, carbons in the second insulating layer pattern 3a may be partially removed from the etch damage portion D1 by, for example, $C_xF_y$-based etching gas or plasma used in the anisotropic etching process. In the case where the second insulating layer 3 is formed of carbon-doped hydrogenated silicon oxide (SiOCH) or porous-carbon-doped hydrogenated silicon oxide (porous-SiOCH), carbon C in the etch damage portion D1 may be reacted with hydrogen or oxygen in the etching gas to form methane ($CH_3$), carbon monoxide (CO), or carbon dioxide ($CO_2$) that can be outgassed from the second insulating layer pattern 3a. As a result, the etch damage portion D1 may have a chemical composition similar to that of silicon oxide ($Si_xO_y$). This means that the etch damage portion D1 can be understood as substantially a carbon-reduced portion of the second insulating layer pattern 3a.

Figure 4:
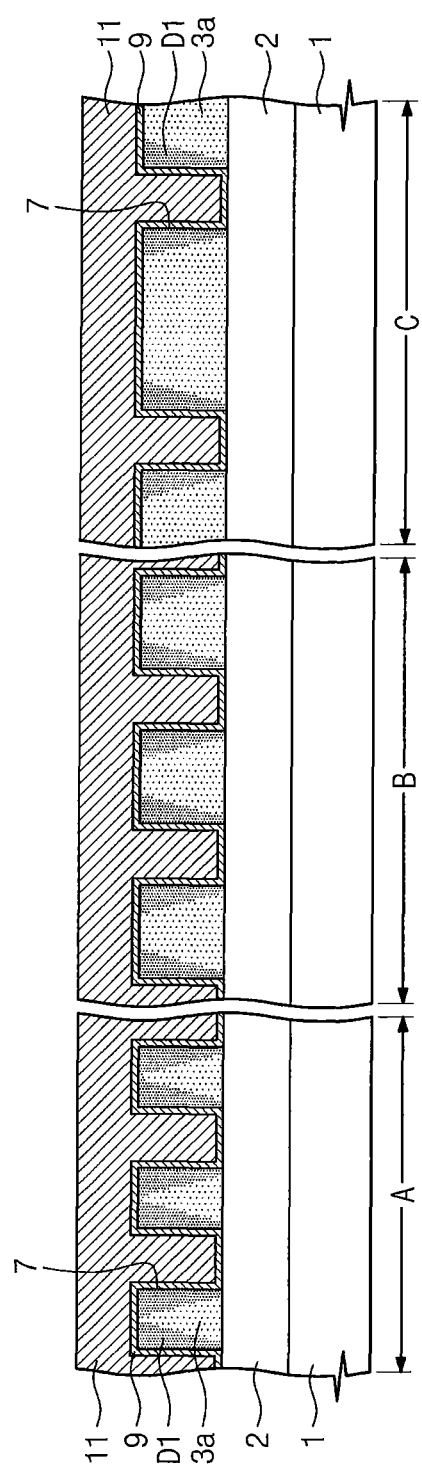

Referring to FIG. 4, the mask pattern 5 may be selectively removed to expose a top surface of the second insulating layer pattern 3a. If the mask pattern 5 is a photoresist pattern, it may be removed by an aching process. Next, a diffusion barrier layer 9 and a conductive layer 11 may be sequentially formed to fill the opening 7. The diffusion barrier layer 9 may be formed of at least one material selected from the group consisting of titanium (Ti), titanium nitride (TiN), tantalum (Ta), tantalum nitride (TaN), ruthenium (Ru), cobalt (Co), manganese (Mn), tungsten nitride (WN), nickel (Ni), and nickel boron (NiB). The diffusion barrier layer 9 may be formed by a deposition process. A seed layer may be formed before the formation of the conductive layer 11. The conductive layer 11 may be formed by a deposition process or a plating process. The conductive layer 11 may include a metal layer (e.g., of copper, tungsten, or aluminum).

Figure 5:
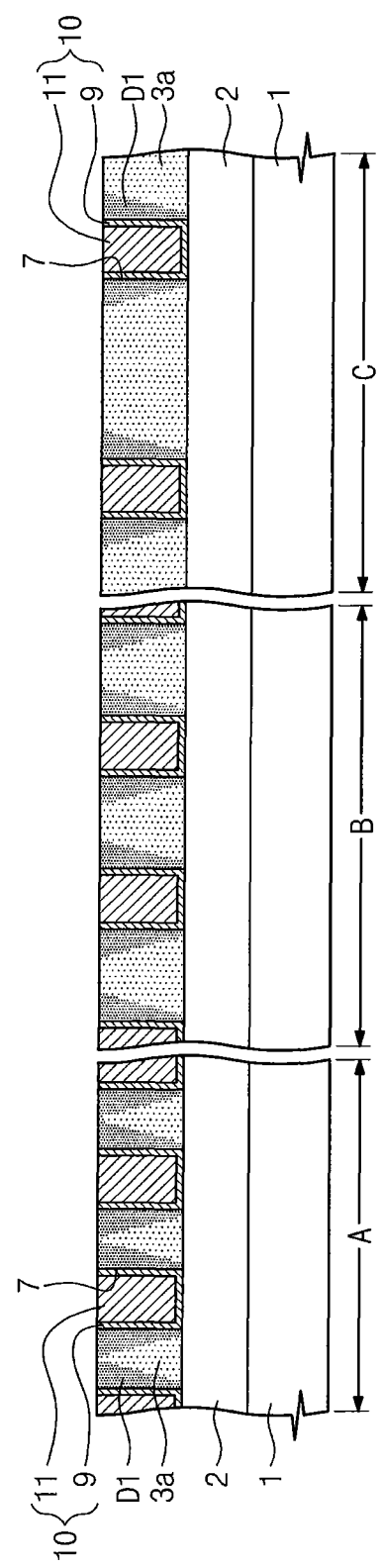

Referring to FIG. 5, a planarization etching process may be performed to the conductive layer 11 and the diffusion barrier layer 9 to remove the diffusion barrier layer 9 and the conductive layer 11 from the top surface of the second insulating layer pattern 3a and form the conductive pattern 10 localized in the opening 7. The planarization etching process may be performed using an etch-back process or a chemical mechanical polishing (CMP) process, such that a top surface of the second insulating layer pattern 3a may be exposed.

Figure 6:
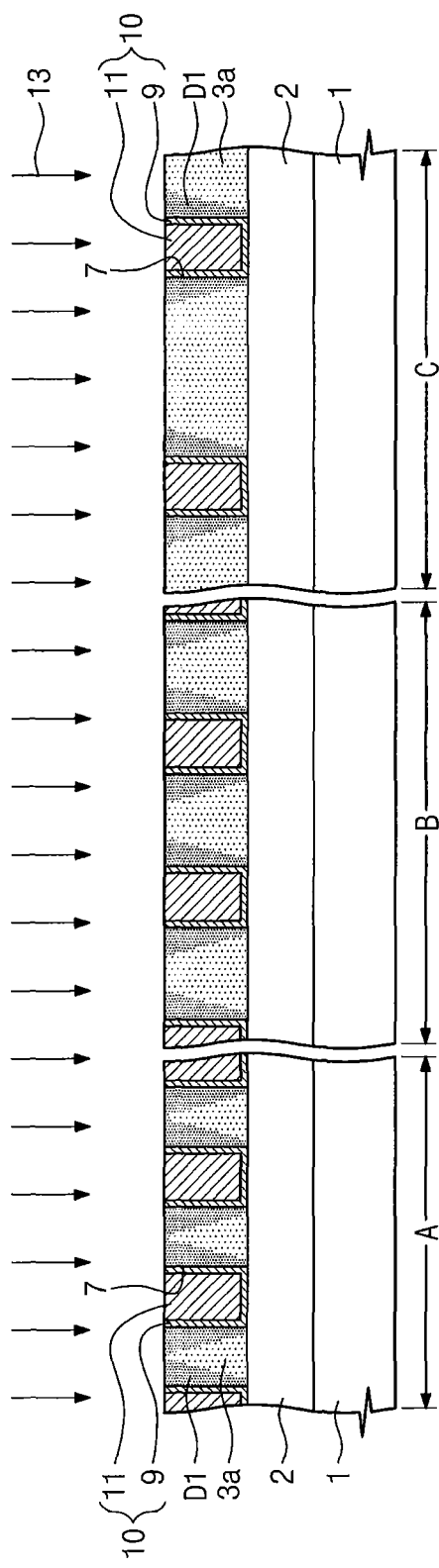

Referring to FIG. 6, a plasma treatment process 13 may be performed to the exposed top surface of the second insulating layer pattern 3a. The plasma treatment process may be performed in such a way that carbon can be selectively removed from the second insulating layer pattern 3a. This may result in an increase in the area of the damaged portion D1. In the first region A, since the conductive patterns 10 are disposed to have a small space, the second insulating layer pattern 3a may have a small volume. Thus, the anisotropic etching process and the plasma treatment may remove carbons from the whole portion (e.g., an entirety) of the second insulating layer pattern 3a provided on the first region A. By contrast, in the third region C, since the conductive patterns 10 are provided to have a large space, the second insulating layer pattern 3a may have a large volume. The efficiency of removing carbon from the second insulating layer pattern 3a may be lowest in the third region C. For example, during the plasma treatment, carbon may be partially removed from a top portion of the second insulating layer pattern 3a in the third region C. In the second region B, since the conductive patterns 10 are provided to have an intermediate space, the carbon removal from the second insulating layer pattern 3a may be performed with a moderate efficiency, compared with those in the first and third regions A and C. For example, in the second region B, carbon may be moderately removed from the second insulating layer pattern 3a. Likewise, the plasma treatment process may be performed in such a way that the carbon removal rate can be controlled depending on a volume of the second insulating layer pattern 3a. In example embodiments, the plasma treatment process may be performed by supplying at least one gas of $H_2$, $NH_3$, $N_2H_2$, $N_2O$, $O_2$, $CO_2$, or CO, with a plasma power of 300-800 W at a temperature of 200-400° C. and a pressure of 3-8 Torr.

Figure 7:
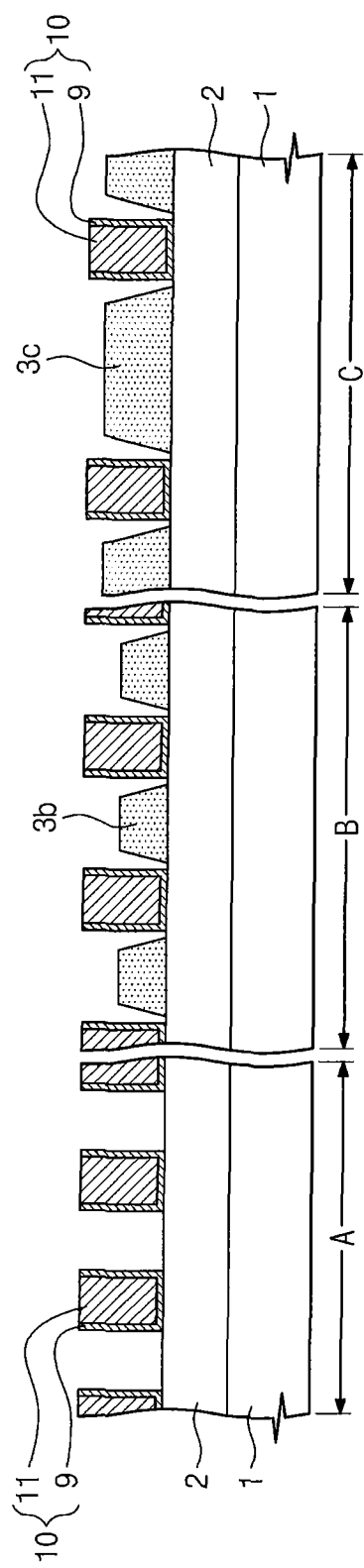

Referring to FIG. 7, at least a portion of the second insulating layer pattern 3a may be removed. For example, the portion D1, from which carbon is exhausted by the anisotropic etching process and the plasma treatment process, may be selectively removed. This process may be performed by a wet etching process using HF solution or a dry etching process using $C_xF_y$-based gas. Since the carbon-reduced portion D1 has the chemical composition similar to a silicon oxide layer ($Si_xO_y$), it can be easily removed by the HF solution or the $C_xF_y$-based gas. By contrast, the carbon-remaining portion may not be etched by the HF solution or the $C_xF_y$-based gas, and may thereby remain after the process. As a result, a supporting pattern 3c may be formed in the third region C, while a remaining pattern 3b may be formed in the second region B to have a size smaller than that of the supporting pattern 3c. In the first region A, the second insulating layer pattern 3a may be completely removed to expose the top surface of the first insulating layer 2.

Figure 8:
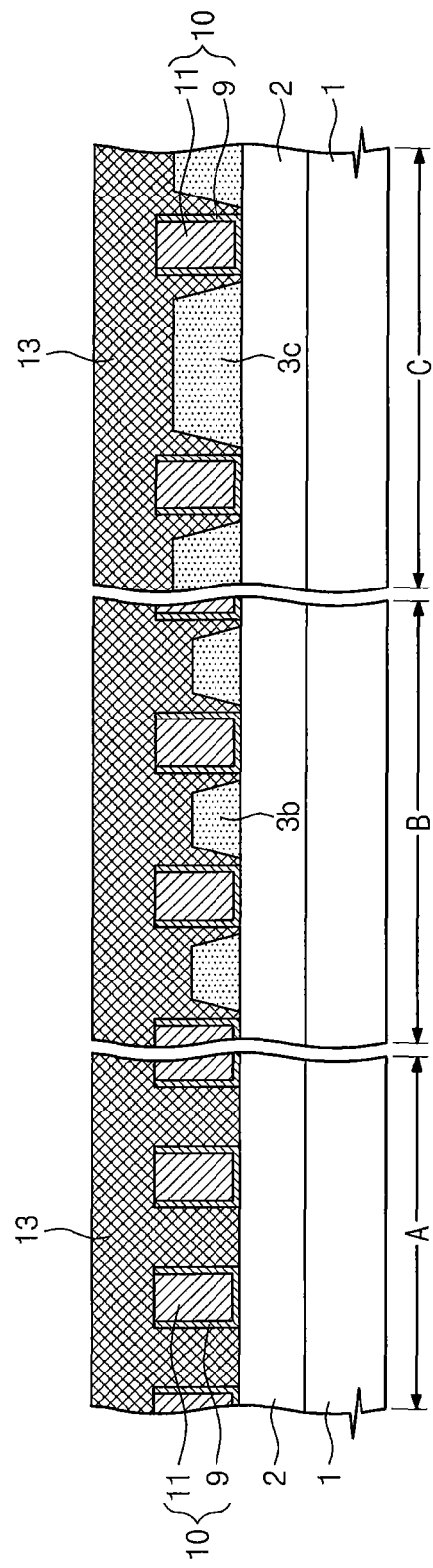

Referring to FIG. 8, a sacrificial layer 13 may be wholly formed on the substrate 1. The sacrificial layer 13 may be formed of hydrocarbon ($C_xH_y$). The sacrificial layer 13 may be formed using a spin-on-dielectrics (SOD) or PE-CVD process. The sacrificial layer 13 may be formed to fill a space between the conductive patterns 11 and cover the top surface of the conductive patterns 11.

Figure 9:
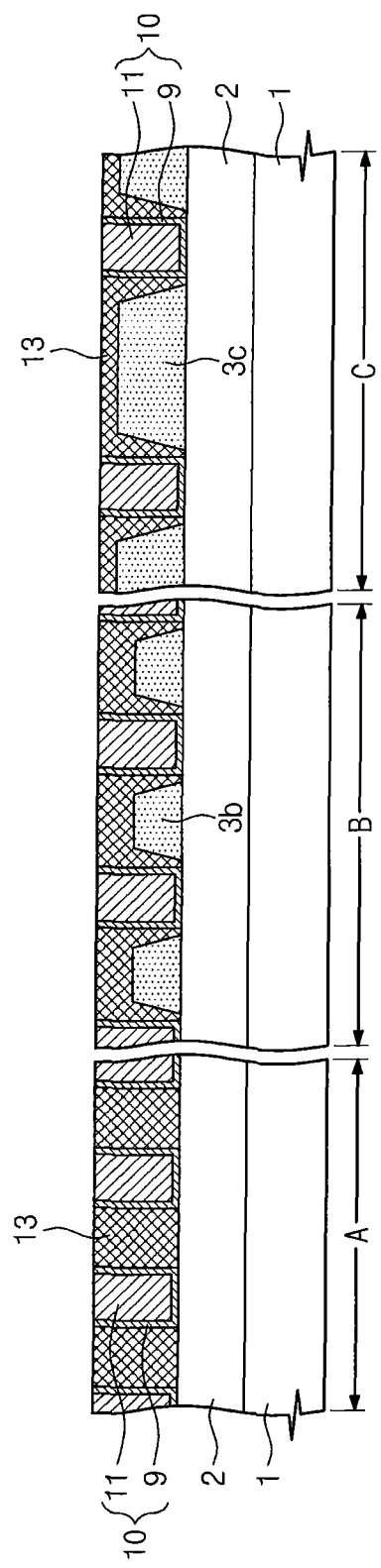

Referring to FIG. 9, a planarization etching process may be performed to the sacrificial layer 13 to remove the sacrificial layer 13 and expose the top surfaces of the conductive patterns 11. The planarization etching process may be performed using an etch-back process or a CMP process.

Figure 10:
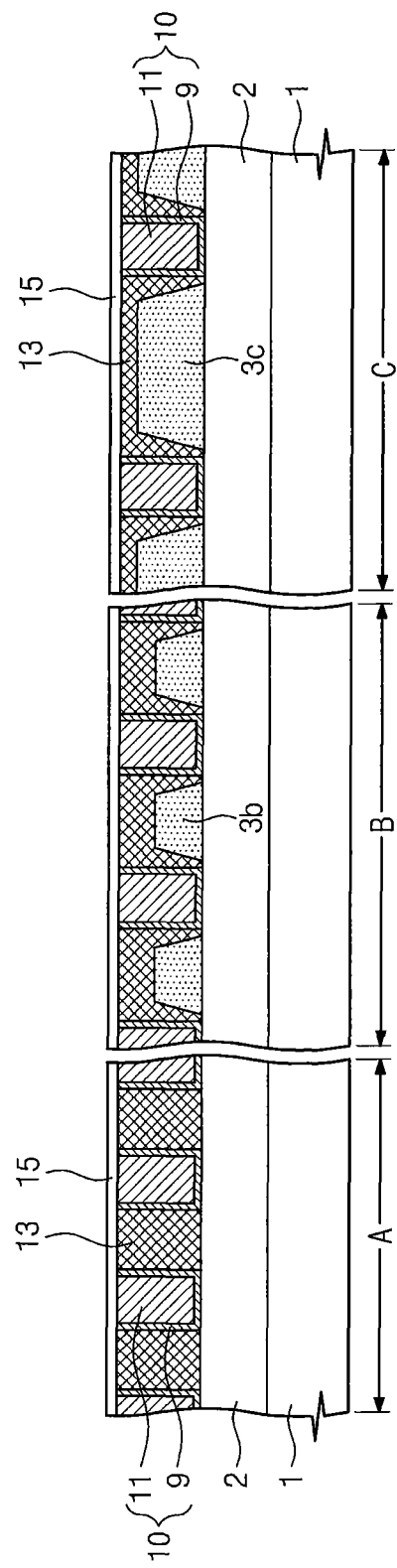

Referring to FIG. 10, a capping layer 15 may be wholly formed on the substrate 1. The capping layer 15 may be formed using an atomic layer deposition (ALD) process, but alternatively, using a plasma-enhanced CVD (PE-CVD), atmospheric pressure CVD (AP-CVD), or a flowable CVD (FCVD). The capping layer 15 may be formed of a dielectric material having a dielectric constant of 1.8-8. For example, the capping layer 15 may be formed of at least one material selected from the group consisting of silicon dioxide ($SiO_2$), silicon nitride (SiN), carbon-doped hydrogenated silicon oxide (SiOCH), silicon carbon nitride (SiCN), and silicon oxynitride (SiON). In example embodiments, the capping layer 15 may be formed of at least one material selected from the group consisting of silicon dioxide ($SiO_2$), carbon-doped hydrogenated silicon oxide (SiOCH), and silicon carbon nitride (SiCN). The capping layer 15 may have a thickness of 0.1 nm-5 nm. The capping layer 15 may be formed to cover the top surfaces of the conductive patterns 10 and the sacrificial layer 13.

Referring back to FIG. 1, the sacrificial layer 13 may be selectively removed under the capping layer 15. For example, an ashing process may be performed to remove the sacrificial layer 13. The ashing process may be performed by supplying gas (e.g., at least one of $NH_3$, $H_2$, $N_2O$, $O_2$, $CO_2$, or CO) capable of producing hydrogen radicals or oxygen radicals at a temperature of 20-400° C. The hydrogen radicals or the oxygen radicals produced in the ashing process may pass through the capping layer 15 and be reacted with hydrocarbon constituting the sacrificial layer 13 to form gas, such as $CH_3$, $CO_2$ or CO, that can be outgassed through the capping layer 15. As the result of the outgassing, the sacrificial layer 13 may be removed to form an air-gap region AG. The supporting pattern may thus be formed of a carbon-containing or other layer having an ashing selectivity to the hydrocarbon-containing sacrificial layer. In example embodiments, a portion of the capping layer 15 may hang down between the conductive patterns 10, after the removal of the sacrificial layer 13. For example, in the third region C with the largest space between the conductive patterns 10, the capping layer 15 may hang down but be prevented from excessively hanging down by the presence of the supporting pattern 3c. By contrast, due to relatively narrow spaces between the conductive patterns 10, the capping layer 15 may hang down rarely in the first and second regions A and B. Accordingly, even in the third region C, it is possible to prevent a falling of the conductive pattern 10, which may occur from the excessive drooping of the capping layer 15.

After the conductive patterns 10 and its neighboring structure are formed, interconnection lines may be further formed on the capping layer 15. Here, to make electrical connections between the interconnection lines and the conductive patterns 10, the capping layer 15 may be partially removed. If there is no supporting pattern in the third region C, the capping layer 15 may hang down excessively, which may lead to difficulty in forming an etch mask pattern precisely on the capping layer 15. However, according to the above-described embodiments of the inventive concept, such a difficulty can be reduced or prevented by the presence of the supporting pattern 3c.

Figure 11:
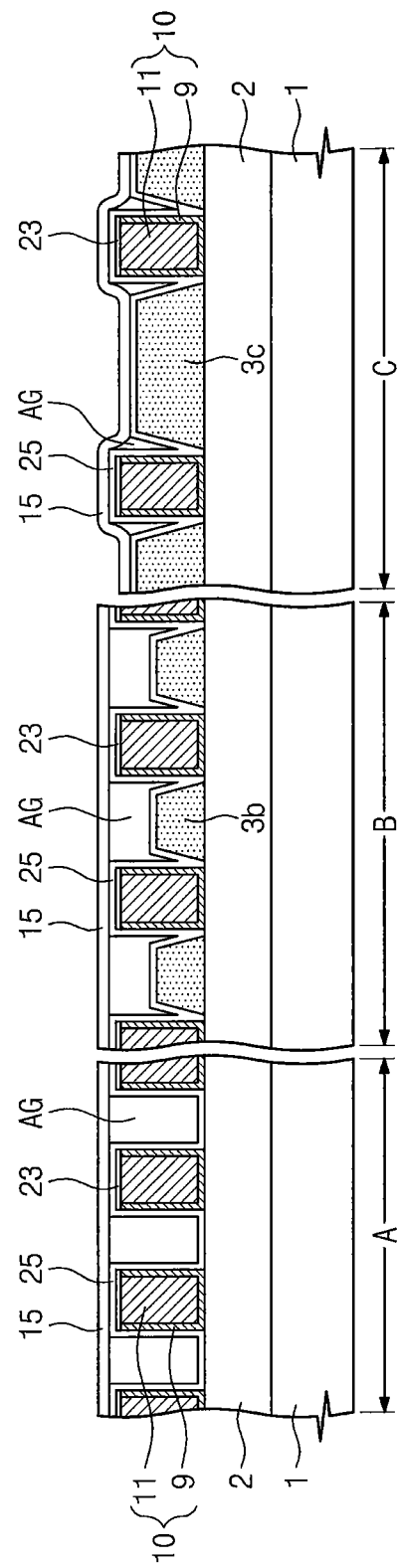
FIG. 11 is a sectional view of a semiconductor device according to other example embodiments of the inventive concept.

FIG. 11 is a sectional view of a semiconductor device according to other example embodiments of the inventive concept.

Referring to FIG. 11, a semiconductor device in the present embodiment may include a first protection layer 23 provided on the top surface of the conductive pattern 10 and a second protection layer 25 provided on a side surface of the conductive pattern 10. The first protection layer 23 and the second protection layer 25 may be formed of different materials from each other. For example, the first protection layer 23 may be formed of at least one of tantalum, ruthenium, cobalt, manganese, titanium, tungsten, nickel, aluminum, oxides thereof, nitrides thereof, or oxynitrides thereof. The second protection layer 25 may be formed of a dielectric material having a dielectric constant of 1.8-8. For example, the second protection layer 25 may be formed of at least one material selected from the group consisting of silicon nitride (SiN), silicon carbon nitride (SiCN) and boron nitride (BN). The second protection layer 25 may extend between a top surface of the first protection layer 23 and the capping layer 15. In the first region A, the second protection layer 25 may extend to cover the first insulating layer 2 between the conductive patterns 10. In the second region B, the second protection layer 25 may extend to cover side and top surfaces of the remaining pattern 3b. A portion of the second protection layer 25 provided on the remaining pattern 3b may be vertically spaced apart from the capping layer 15 thereon. In the third region C, the second protection layer 25 may extend to cover a side surface of the supporting pattern 3c and to be interposed between the supporting pattern 3c and the capping layer 15. Except for this difference, the semiconductor device in the present embodiment may be configured to have substantially the same features as that of the previous embodiment described with reference to FIG. 1.

FIGS. 12 through 16 are sectional views illustrating a process of fabricating the semiconductor device of FIG. 11.

Figure 12:
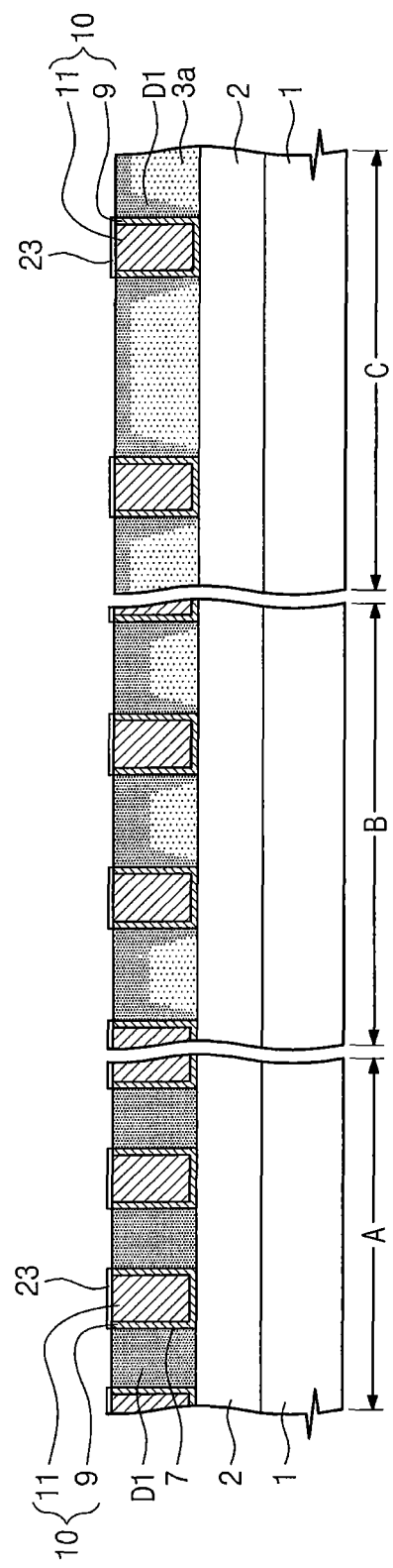
FIGS. 12 through 16 are sectional views illustrating a process of fabricating the semiconductor device of FIG. 11.

Referring to FIG. 12, a first protection layer 23 may be formed on the top surface of the conductive patterns 10, after the plasma treatment 13 may be performed to the second insulating layer pattern 3a as described with reference to FIG. 6. The formation of the first protection layer 23 may be performed before removing at least a portion of the second insulating layer pattern 3a. The first protection layer 23 may be formed of at least one of tantalum, ruthenium, cobalt, manganese, titanium, tungsten, nickel, aluminum, oxides thereof, nitrides thereof, or oxynitrides thereof. The first protection layer 23 may be formed by performing a deposition process and an etching process. Alternatively, the first protection layer 23 may be formed by a plating process, when it is formed of only a metal layer.

Figure 13:
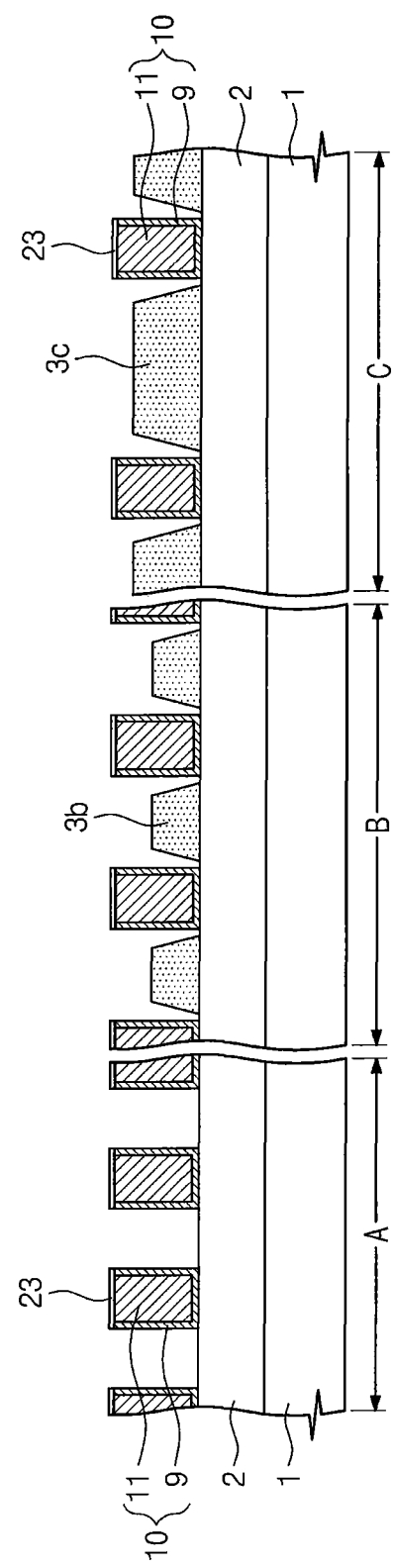

Referring to FIG. 13, at least a portion of the second insulating layer pattern 3a may be removed from the resulting structure covered with the first protection layer 23. This process may be performed by a wet etching process using HF solution or a dry etching process using $C_xF_y$-based gas. Since the carbon-reduced portion D1 has the chemical composition similar to a silicon oxide layer ($Si_xO_y$), it can be easily removed by the HF solution or the $C_xF_y$-based gas. By contrast, the carbon-remaining portion may not be etched by the HF solution or the $C_xF_y$-based gas, and may thereby remain after the process. As a result, a supporting pattern 3c may be formed in the third region C, while a remaining pattern 3b may be formed in the second region B to have a size smaller than that of the supporting pattern 3c. In the first region C, the second insulating layer pattern 3a may be completely removed to expose the top surface of the first insulating layer 2. Here, the first protection layer 23 may protect the top surface of the conductive pattern 10 against etch damage during the etching process. The sidewall of the conductive pattern 10 may be protected by the diffusion barrier layer 9 provided thereon.

Figure 14:
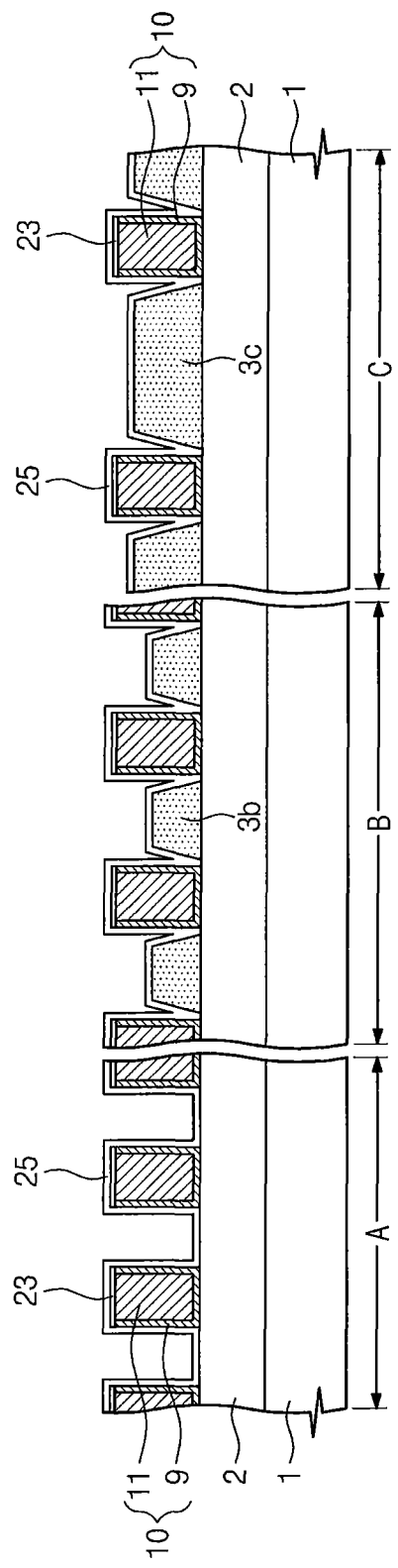

Referring to FIG. 14, a second protection layer 25 may be conformally formed on the substrate 1. The second protection layer 25 may be formed of a dielectric material having a dielectric constant of 1.8-8. For example, the second protection layer 25 may be formed of at least one material selected from the group consisting of silicon nitride (SiN), silicon carbon nitride (SiCN) and boron nitride (BN). The second protection layer 25 may be formed using one of ALD, PE-CVD, AP-CVD, and FCVD processes. In example embodiments, the second protection layer 25 may be formed to cover fully an exposed surface of the conductive pattern 10, and thus, it is possible to reduce or prevent a slit void from being formed in the conductive pattern 10 and/or between the diffusion barrier layer 9 and the conductive layer 11.

Figure 15:
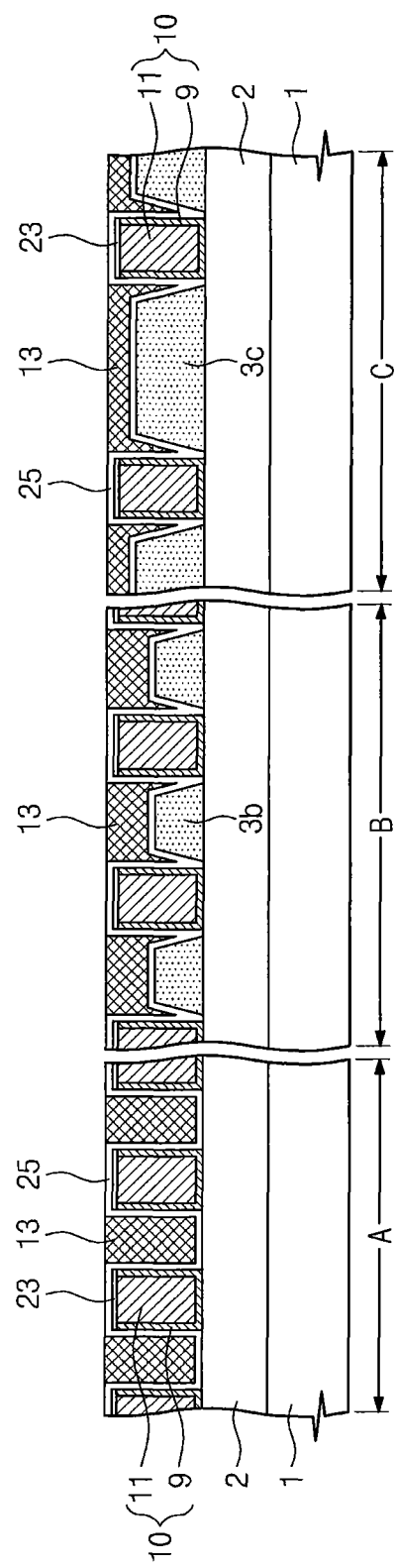

Referring to FIG. 15, a sacrificial layer 13 may be formed on the substrate 1. The sacrificial layer 13 may be formed of hydrocarbon ($C_xH_y$). In example embodiments, the sacrificial layer 13 may be formed using a spin-on-dielectrics (SOD) or PE-CVD process. The sacrificial layer 13 may be formed to fill a space between the conductive patterns 11 and cover the top surface of the conductive patterns 11. A planarization etching process may be performed to the sacrificial layer 13 to expose the top surface of the second protection layer 25.

Figure 16:
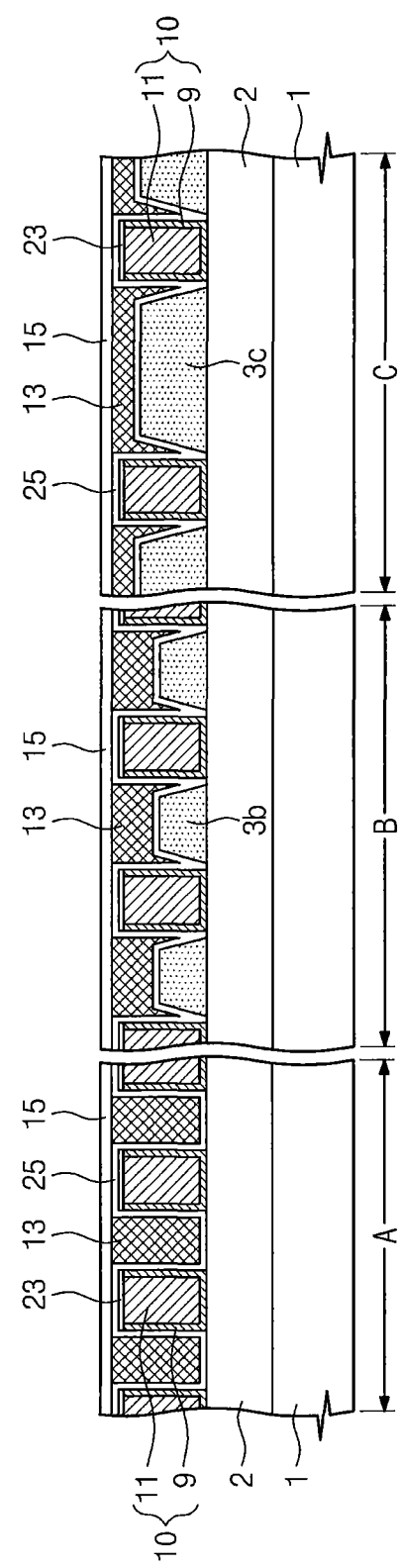

Referring to FIG. 16, a capping layer 15 may be formed on the substrate 1. The capping layer 15 may be formed using an ALD process, or alternatively, using one of PE-CVD, AP-CVD, and FCVD. The capping layer 15 may be formed of a dielectric material having a dielectric constant of 1.8-8. For example, the capping layer 15 may be formed of at least one material selected from the group consisting of silicon dioxide ($SiO_2$), silicon nitride (SiN), carbon-doped hydrogenated silicon oxide (SiOCH), silicon carbon nitride (SiCN), and silicon oxynitride (SiON). In example embodiments, the capping layer 15 may be formed of at least one material selected from the group consisting of silicon dioxide ($SiO_2$), carbon-doped hydrogenated silicon oxide (SiOCH), and silicon carbon nitride (SiCN). The capping layer 15 may be formed to have a thickness of 0.1 nm-5 nm.

The capping layer 15 may be formed to cover top surfaces of the second protection layer 25 and the sacrificial layer 13.

Referring back to FIG. 11, the sacrificial layer 13 may be selectively removed under the capping layer 15. For example, an ashing process may be performed to remove the sacrificial layer 13. The ashing process may be performed by supplying gas (e.g., at least one of $NH_3$, $H_2$, $N_2O$, $O_2$, $CO_2$, or CO) capable of producing hydrogen radicals or oxygen radicals at a temperature of 20-400° C. Accordingly, the sacrificial layer 13 may be removed to form an air-gap region AG. In example embodiments, a portion of the capping layer 15 may hang down between the conductive patterns 10, after the removal of the sacrificial layer 13. For example, in the third region C where the space or separation between the conductive patterns 10 is widest, the capping layer 15 may hang down and be in contact with the second protection layer 25 on the supporting pattern 3c.

Figure 17:
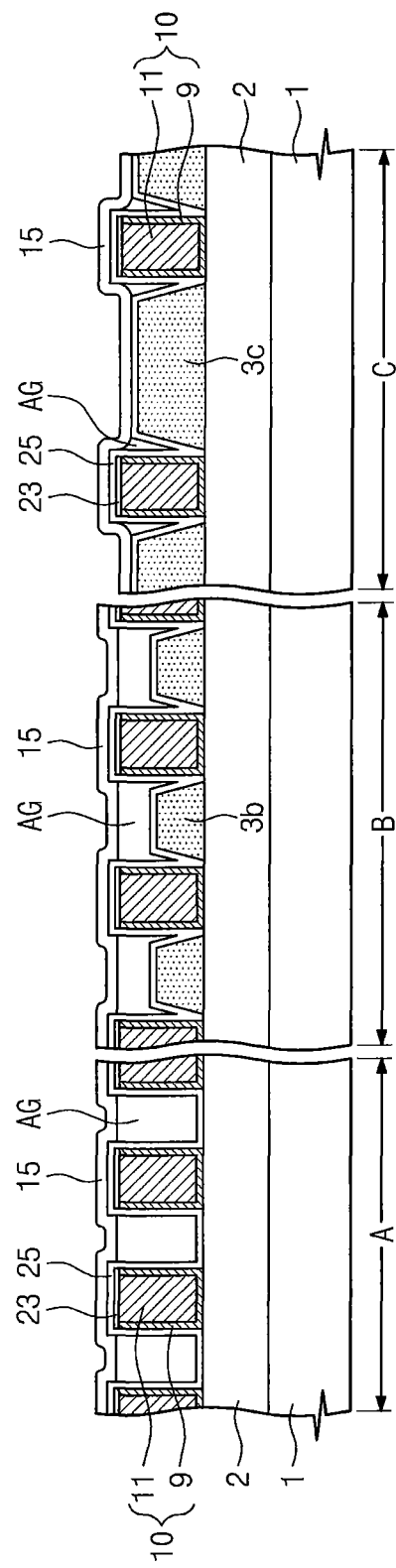
FIG. 17 is a sectional view of a semiconductor device according to still other example embodiments of the inventive concept.

FIG. 17 is a sectional view of a semiconductor device according to still other example embodiments of the inventive concept.

Referring to FIG. 17, in a semiconductor device according to the present embodiment, the capping layer 15 may be formed to cover not only the top surface but also a portion of a side surface of the second protection layer 25. Except for this difference, the semiconductor device in the present embodiment may be configured to have substantially the same features as that of the previous embodiment described with reference to FIG. 11.

Figure 18:
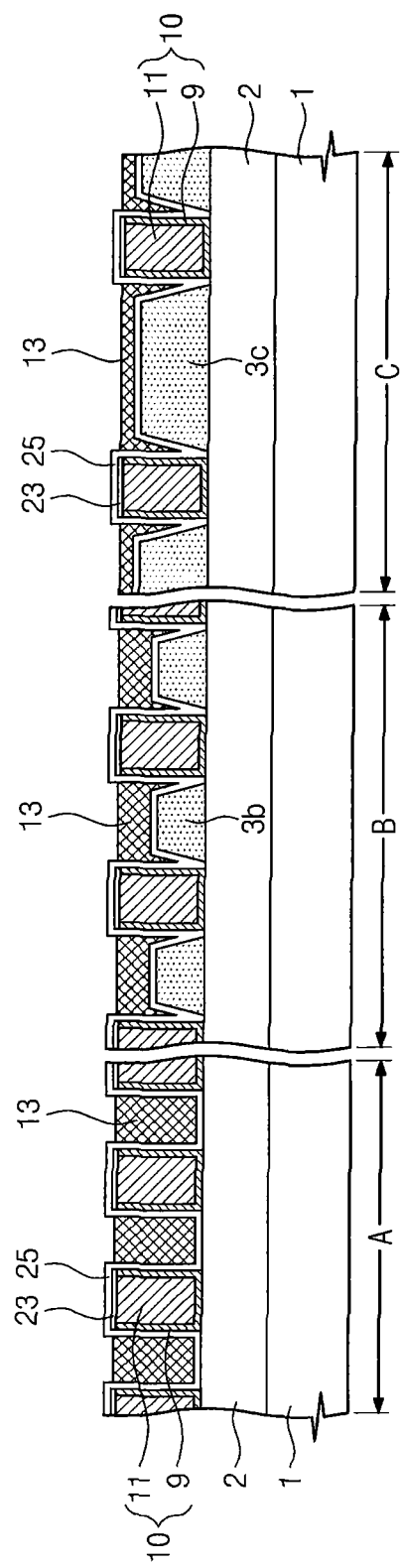
FIGS. 18 and 19 are sectional views illustrating a process of fabricating the semiconductor device of FIG. 17.
Figure 19:
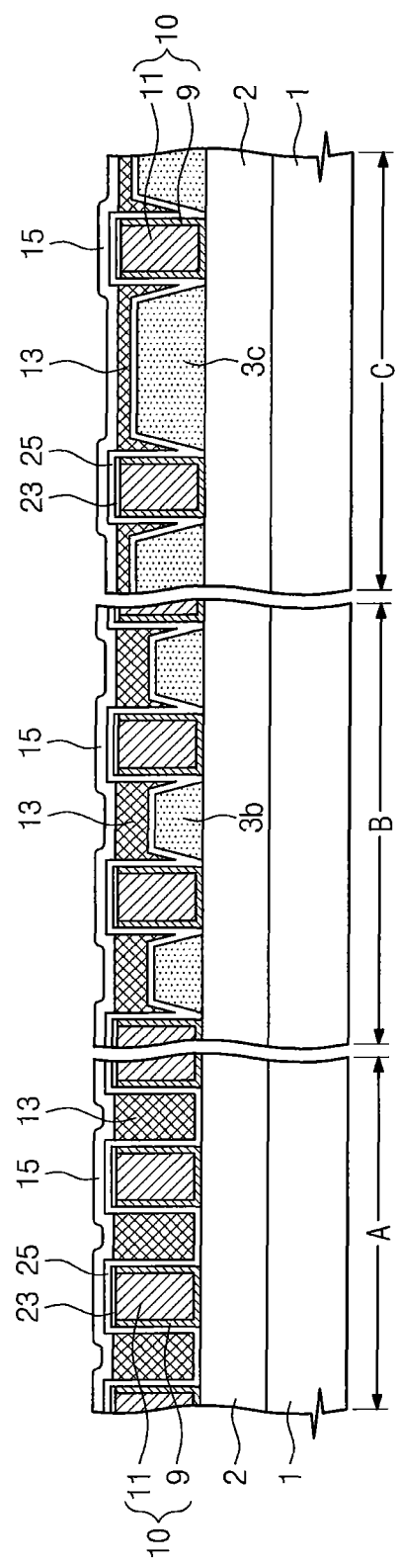

FIGS. 18 and 19 are sectional views illustrating a process of fabricating the semiconductor device of FIG. 17.

Referring to FIG. 18, the planarization etching process to the sacrificial layer 13, e.g., in FIG. 15, may be performed using an etch-back process. If the etch-back process is performed in an over-etch manner, the sacrificial layer 13 may be recessed to have a top surface that is lower than that of the second protection layer 25. For example, the sidewall of the second protection layer 25 may be partially exposed by the etch-back process.

Referring to FIG. 19, a capping layer 15 may be formed on the substrate 1 to cover the exposed sidewall of the second protection layer 25. Thereafter, the sacrificial layer 13 may be removed by an ashing process, thereby forming the structure of FIG. 17.

Figure 20:
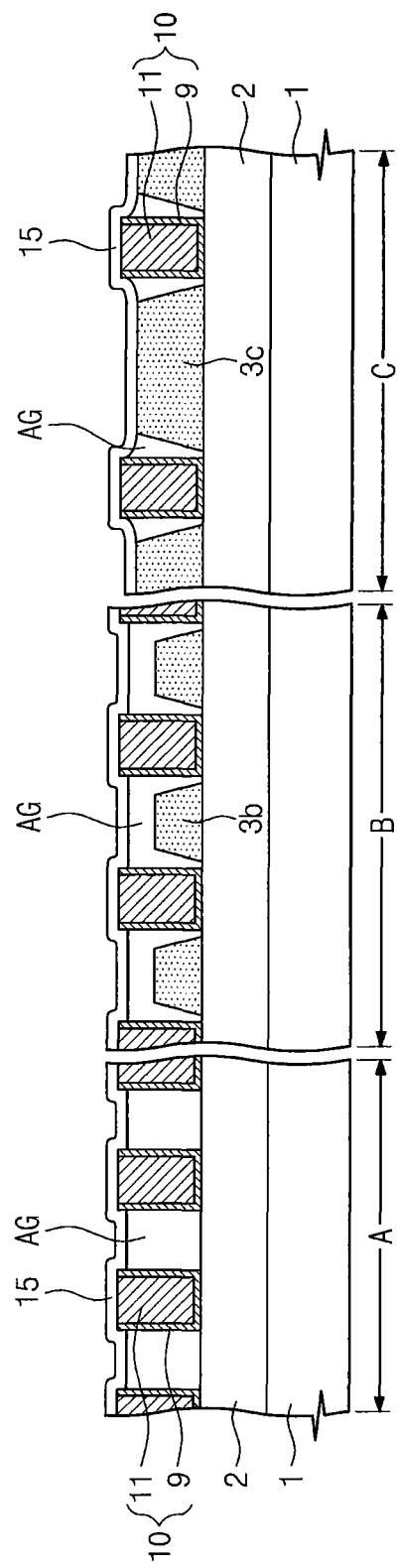
FIG. 20 is a sectional view of a semiconductor device according to even other example embodiments of the inventive concept.

FIG. 20 is a sectional view of a semiconductor device according to even other example embodiments of the inventive concept.

Referring to FIG. 20, the first and second protection layers 23 and 25 may not be provided in a semiconductor device according to the present embodiment, similar to the structure of FIG. 1. However, the capping layer 15 may be formed to cover partially an upper sidewall of the conductive pattern 10. Except for this difference, the semiconductor device in the present embodiment may be configured to have substantially the same features as that of the previous embodiment described with reference to FIG. 1.

The formation of the semiconductor device of FIG. 20 may include performing an etch-back process to the resulting structure of FIGS. 8 and 9. The etch-back process may be performed in an over-etch manner to expose an upper sidewall of the conductive pattern 10. Thereafter, a capping layer 15 may be formed on the substrate 1, and the sacrificial layer 13 may be removed by an ashing process, thereby forming the structure of FIG. 20.

Conductive patterns and their neighboring structures for the semiconductor device have been described until now. In certain embodiments, the structure in the first region A may be used to realize bit lines in a cell array region of memory chips, such as NAND FLASH memory devices or phase-change random access memory devices. The structure in the third region C may be used to realize peripheral circuits of the memory chips or interconnection structures of logic chips. The structure in the second region B may be used to realize interconnection structures of the memory or logic chips.

Figure 21A:
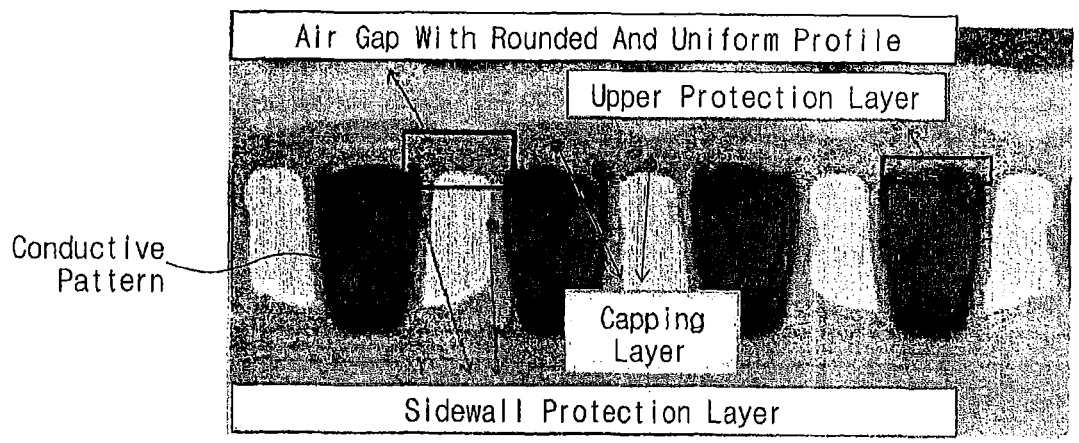
FIGS. 21A through 21C are sectional images showing semiconductor devices fabricated by the processes according to the example embodiments of the inventive concept.
Figure 21B:
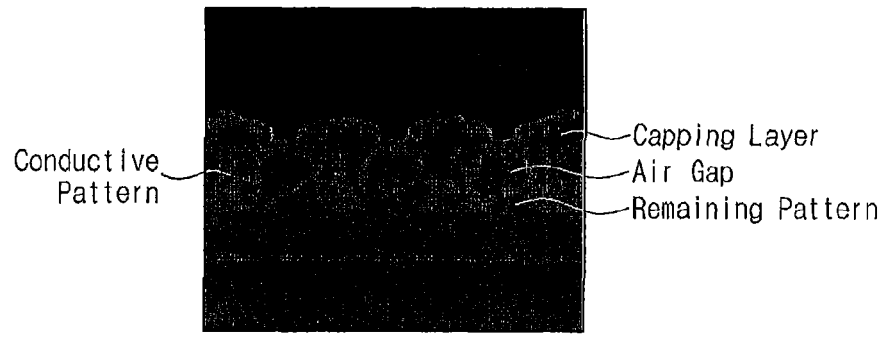
Figure 21C:
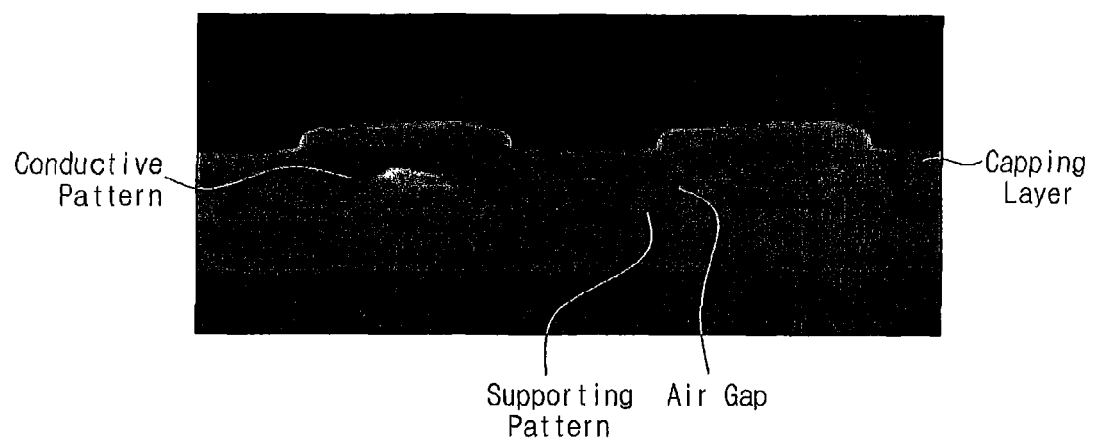

FIGS. 21A through 21C are sectional images showing semiconductor devices fabricated by the processes according to the example embodiments of the inventive concept.

FIG. 21A shows a transmission electron microscope (TEM) image obtained from a sample that was fabricated using processes according to example embodiments of the inventive concept. In detail, in the sample, the second insulating layer 3 was formed of porous-carbon-doped hydrogenated silicon oxide (SiOCH) as described with reference to FIG. 2, and then, was patterned to form the opening 7 as described with reference to FIG. 3. As described with reference to FIGS. 4 and 5, the conductive patterns 10 including conductive layers 11 made of copper were formed to fill the opening 7. Here, the conductive patterns 10 were formed to have a space therebetween of about 40 nm. As shown in FIG. 6, hydrogen gas plasma was used to treat the second insulating layer pattern 3a. As shown in FIG. 12, the first protection layer 23 was formed of copper silicon nitride (CuSiN) to cover the top surface of the conductive pattern 11, and then, as shown in FIG. 14, the second protection layer 25 was formed of SiCN to cover the sidewall of the conductive pattern 11.

As shown in FIG. 15, the sacrificial layer 13 was formed of a hydrocarbon ($C_xH_y$) layer to fill a space between the conductive patterns 11 using the SOD process. As shown in FIG. 16, the capping layer 15 of about 4 nm was formed of silicon oxide using the ALD process. Thereafter, as described with reference to FIG. 11, the ashing process using oxygen gas was performed to remove the sacrificial layer 13. FIG. 21A is a TEM image of the resulting structure. As shown in FIG. 21A, well-defined air-gaps were formed between the conductive patterns. Similarly, the capping layer on the air-gap region was formed to have a well-defined bottom surface. This is because the capping layer was the silicon oxide layer, which was formed by the ALD process and was solid enough to be able to preserve its own form even after the removal of the sacrificial layer.

FIGS. 21B and 21C show virtual scanning electron microscope (VSEM) images obtained from samples that were fabricated using processes according to other example embodiments of the inventive concept. In the sample of FIG. 21B, the conductive patterns were formed to have a space therebetween of about 60 nm, and in the sample of FIG. 21C, the conductive patterns were formed to have a space therebetween of about 200 nm. The samples of FIGS. 21B and 21C were fabricated by the same process and of the same material as that described with reference to FIG. 21A, except that an upper portion of the sacrificial layer 13 was over-etched to expose the upper sidewall of the second protection layer 23 as described with reference to FIG. 18. As shown in FIG. 21B, a remaining pattern and an air-gap were formed between the conductive patterns, and as shown in FIG. 21C, a supporting pattern and an air-gap were formed between the conductive patterns. The remaining pattern and the supporting pattern were formed of porous-carbon-doped hydrogenated silicon oxide, similar to the second insulating layer 3 of FIG. 21A.

Likewise, as the space between the conductive patterns decreases, a volumetric ratio of the air-gap to the space between the conductive patterns increases. Since the air-gap region has a low dielectric constant of about 1, the air-gap region provided between the conductive patterns can reduce or suppress capacitive coupling between the conductive patterns and thus, it may be possible to reduce or suppress signal transfer speed from being decreased. In addition, since the supporting pattern is provided in a region where a space between the conductive patterns is relatively large, it may be possible to reduce or prevent the capping layer from hanging down excessively.

Figure 22:
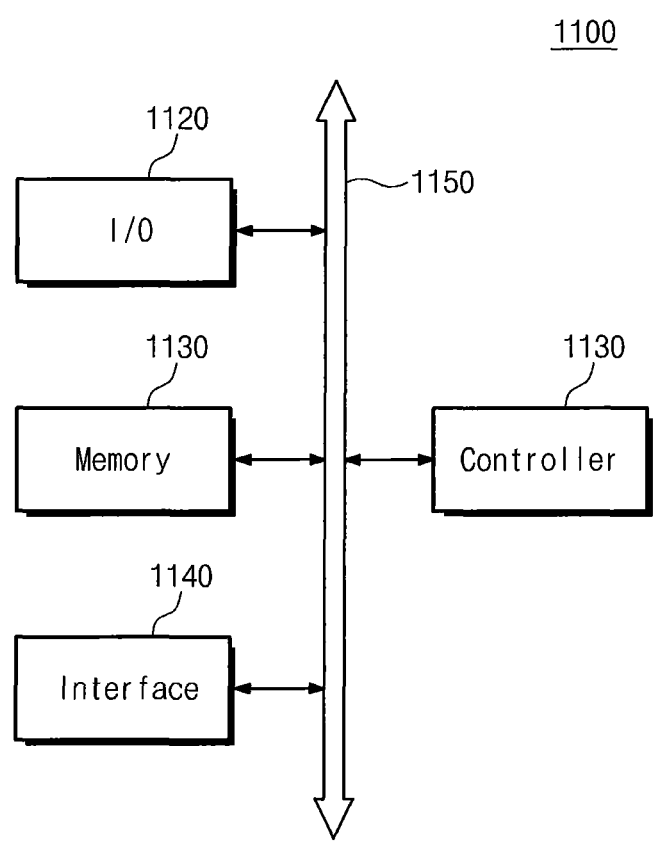
FIG. 22 is a schematic block diagram illustrating an example of memory systems including semiconductor devices according to example embodiments of the inventive concept.

FIG. 22 is a schematic block diagram illustrating an example of memory systems including semiconductor devices according to example embodiments of the inventive concept.

Referring to FIG. 22, a memory system 1100 can be applied to a personal digital assistant (PDA), a portable computer, a web tablet, a wireless phone, a mobile phone, a digital music player, a memory card and/or other devices that can transmit and/or receive data in a wireless communication environment.

The memory system 1100 includes a controller 1110, an input/output device 1120 such as a keypad and a display device, a memory 1130, an interface 1140 and a bus 1150. The memory 1130 and the interface 1140 communicate with each other through the bus 1150.

The controller 1110 includes at least one microprocessor, at least one digital signal processor, at least one micro controller and/or other processor devices similar to the microprocessor, the digital signal processor and the micro controller. The memory 1130 may be used to store an instruction executed by the controller 1110. The input/output device 1120 can receive data or a signal from outside of the system 1100 or transmit data or a signal outside of the system 1100. For example, the input/output device 1120 may include a keyboard, a keypad and/or a display.

The memory 1130 includes at least one of the nonvolatile memory devices according to example embodiments of the inventive concepts. The memory 1130 may further include a different kind of memory, a volatile memory device capable of random access, and/or various other kinds of memories.

The interface 1140 transmits data to a communication network and/or receives data from a communication network.

According to example embodiments of the inventive concept, in a semiconductor device, conductive patterns and a capping layer thereon may be formed to define an air-gap region between the conductive patterns. Due to low dielectric constant of the air-gap region, it is possible to reduce or suppress electrical interference between the conductive patterns. This can enables improved signal transfer speed and/or reduced power consumption.

Further, a supporting pattern may be provided between widely spaced ones of the conductive patterns to reduce or prevent the capping layer thereon from hanging down excessively or collapsing. Accordingly, it may be possible to reduce or prevent a falling of the conductive pattern and/or technical problems in a subsequent process, which may occur due to excessive drooping of the capping layer. In other words, supporting patterns having dimensions sufficient to support an overlying capping layer may be formed in various regions of a substrate, where the dimensions of the supporting patterns may depend on the spacing between the conductive patterns in the various regions. The supporting patterns can thus enable improved reliability of the semiconductor device.

In the semiconductor device, protection layers may be provided to cover top and side surfaces of the conductive pattern, and consequently, to improve reliability of the conductive patterns.

According to fabricating methods of example embodiments, the air-gap region may be formed to have a controllable size and/or position.

In addition, according to some fabrication methods described herein, the supporting pattern can be automatically formed between the widely spaced ones of the conductive patterns. This means that the supporting pattern can be formed without additional photolithography processes and/or without changing a photomask design to be used. In other words, the fabrication process can be simplified.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating an integrated circuit device, the method comprising:
    forming spaced apart conductive patterns on a substrate surface;
    forming respective supporting patterns on the substrate surface between adjacent ones of the conductive patterns and separated therefrom by respective gap regions by performing a plasma treatment process on respective insulating layers between the adjacent ones of the conductive patterns, wherein the adjacent ones of the conductive patterns extend away from the substrate surface beyond a top surface of the respective supporting pattern therebetween; and
    forming a capping layer on respective surfaces of the conductive patterns and on the top surface of the respective supporting patterns.

2. The method of claim 1, wherein the plasma treatment process increases an etch selectivity of peripheral portions of the respective insulating layers relative to portions thereof that define the respective supporting patterns, and wherein forming the respective supporting patterns further comprises:
    selectively etching the peripheral portions of the respective insulating layers between the adjacent ones of the conductive patterns after performing the plasma treatment process.

3. The method of claim 2, wherein the respective insulating layers comprise a carbon-containing material, and wherein the plasma treatment process removes carbon from the peripheral portions of the respective insulating layers.

4. The method of claim 3, wherein performing the plasma treatment process comprises supplying a gas comprising $H_2$, $NH_3$, $N_2H_2$, $N_2O$, $O_2$, $CO_2$, or $CO$, with a power of 300-800 W at a temperature of 200° C. to 400° C. and a pressure of 3 Torr to 8 Torr.

5. The method of claim 3, further comprising
    forming a sacrificial layer between the adjacent ones of the conductive patterns after forming the respective supporting patterns;
    wherein forming a capping layer comprises forming the capping layer on the respective surfaces of the conductive patterns, on the top surface of the respective supporting pattern therebetween, and on the sacrificial layer, and further comprising:
    removing the sacrificial layer after forming the capping layer thereon to define the respective gap regions.

6. The method of claim 5, wherein the sacrificial layer comprises a hydrocarbon-containing material, wherein the respective supporting patterns comprise the carbon-containing material having an ashing selectivity to the hydrocarbon-containing material, and wherein removing the sacrificial layer comprises:
    performing an ashing process that decomposes the sacrificial layer into a gas,
    wherein the capping layer is configured to permit the gas to be outgassed therethrough.

7. A method of fabricating an integrated circuit device, the method comprising:
    forming spaced apart conductive patterns on a substrate surface;
    forming respective supporting patterns on the substrate surface between adjacent ones of the conductive patterns and separated therefrom by respective gap regions, by:
        performing a plasma treatment process on respective insulating layers between the adjacent ones of the conductive patterns, wherein the plasma treatment process removes carbon from peripheral portions of the respective insulating layers; and
        selectively etching the peripheral portions of the respective insulating layers between the adjacent ones of the conductive patterns to define the respective supporting patterns and the respective gap regions separating the respective supporting patterns from the adjacent ones of the conductive patterns,
    wherein the adjacent ones of the conductive patterns extend away from the substrate surface beyond a top surface of the respective supporting pattern therebetween; and
    forming a capping layer on respective surfaces of the conductive patterns and on the top surface of the respective supporting patterns.

8. The method of claim 7, wherein, responsive to selectively etching, dimensions of the respective supporting patterns are reduced as spacing between the adjacent ones of the conductive patterns is decreased.

9. A method of fabricating a semiconductor device, comprising:
    forming an insulating layer on a substrate;
    patterning the insulating layer to form a plurality of recessed regions;
    forming conductive patterns to fill the recessed regions;
    performing a plasma treatment with respect to the insulating layer;
    removing at least a portion of the insulating layer to expose sidewalls of the conductive patterns; and
    forming a sacrificial layer to fill a space between the conductive patterns;
    forming a capping layer on the conductive patterns and the sacrificial layer; and
    removing the sacrificial layer to form an air-gap region between the conductive patterns.

10. The method of claim 9, wherein the removing at least a portion of the insulating layer comprises forming a supporting pattern, wherein the supporting pattern is in contact with the capping layer after the removal of the sacrificial layer.

11. The method of claim 9, wherein the removing at least a portion of the insulating layer comprises forming a remaining pattern spaced apart from the capping layer, wherein the remaining pattern is spaced apart from the capping layer after the removal of the sacrificial layer.

12. The method of claim 9, wherein the recessed regions are formed using an anisotropic etching process.

13. The method of claim 9, wherein the insulating layer is formed of a carbon-containing material, and wherein the etching process and the plasma treatment are performed to remove carbons from at least a portion of the insulating layer.

14. The method of claim 9, wherein performing the plasma treatment with respect to the insulating layer comprises supplying at least one gas of $H_2$, $NH_3$, $N_2H_2$, $N_2O$, $O_2$, $CO_2$, or CO, with a plasma power of 300-800 W at a temperature of 200-400° C. and a pressure of 3-8 Torr.

15. The method of claim 9, wherein the sacrificial layer is formed of a hydrocarbon layer.

16. The method of claim 9, wherein the capping layer is formed using at least one deposition process of ALD, PE-CVD, AP-CVD, or FCVD.

17. The method of claim 9, wherein the removing the sacrificial layer comprises performing an ashing process that decomposes the sacrificial layer into gas that is outgassed through the capping layer.

18. The method of claim 17, wherein the ashing process comprises supplying at least one gas of $NH_3$, $H_2$, $N_2O$, $O_2$, $CO_2$, or CO at a temperature of 20-400° C.

19. The method of claim 9, further comprising forming a first protection layer to cover top surfaces of the conductive patterns, before the removing at least a portion of the insulating layer.

20. The method of claim 19, further comprising forming a second protection layer to cover the conductive patterns, after the removing at least a portion of the insulating layer and before the forming the sacrificial layer.

* * * * *